United States Patent [19]

Steinbrecher

[11] 4,230,956

[45] Oct. 28, 1980

[54] DOUBLY BALANCED MIXER WITH OPTIMIZED DYNAMIC RANGE

[75] Inventor: Donald H. Steinbrecher, Carlisle, Mass.

[73] Assignee: Steinbrecher Corporation, Woburn, Mass.

[21] Appl. No.: 906,214

[22] Filed: May 15, 1978

Related U.S. Application Data

[62] Division of Ser. No. 725,714, Sep. 23, 1976, Pat. No. 4,112,374.

[51] Int. Cl.³ ............................................. H03K 17/74
[52] U.S. Cl. ................................... 307/257; 307/353; 328/151; 328/208
[58] Field of Search ............... 307/256, 257, 259, 321, 307/353; 328/20, 151, 208

[56] References Cited

U.S. PATENT DOCUMENTS

| | | | |
|---|---|---|---|
| 3,596,191 | 7/1971 | Stuckert | 328/208 X |
| 3,600,691 | 8/1971 | Caywood, Jr. | 328/208 X |

*Primary Examiner*—John Zazworsky
*Attorney, Agent, or Firm*—Irving M. Kriegsman

[57] ABSTRACT

A circuit for mixing first and second rf signals to produce an output signal containing a beat frequency comprises a pair of switches each of which has a four diode bridge controlled by the first rf signal. The first rf signal is coupled to a balanced current divider with common mode signal rejection. Load resistors coupled to the bridges provide matched termination of the first rf signal irrespective of the conductive state of the bridges. The value of the resistors and the characteristic impedance of the drive circuit is related to the characteristics of the diodes utilized to maximize the dynamic range of the mixer. Circuitry is provided for coupling all diodes of each bridge in series with respect to the average dc component of the first rf signal and to properly terminate the average dc component. The two diode bridges are conductive and non-conductive in opposing half cycles of the first rf signal. A hybrid has its summing port coupled to the switch port of one bridge and its difference port coupled to the switch port of the other bridge. The second rf signal is coupled to input port of the hybrid which includes a balun for balancing and rejecting common mode signals from the second rf signal. The beat frequency is provided at the output port of the hybrid which also includes a balun for rejecting common mode signals. The desired and filtered frequency components of the second rf signal are properly terminated.

5 Claims, 9 Drawing Figures

DOUBLY BALANCED MIXER WITH OPTIMIZED DYNAMIC RANGE

This is a division of application Ser. No. 725,714 filed Sept. 23, 1976, now U.S. Pat. No. 4,112,374.

BACKGROUND OF THE INVENTION

The present invention generally relates to the art of controlling diode switches by an rf signal and, more specifically, to circuits, such as mixers and the like, which incorporate diode switches.

A mixer is a three-port, time-varying network which translates an rf signal at one frequency to some other frequency. To effect this translation, this rf signal is heterodyned or mixed with an rf signal from a local oscillator. This process generates two primary sidebands which are equal to the sum and difference between the two rf signal frequencies.

One known mixer is termed a ring modulator type of doubly-balanced mixer. This circuit comprises a single diode bridge switch in which each of four branches includes a diode. The diodes are coupled in series in the same conduction sense so as to form a ring arrangement. The local oscillator signal is coupled across control terminals of the bridge so that the two pairs of diodes are alternately conducting and non-conducting depending on the instantaneous phase of the local oscillator signal. The rf signal to be converted is coupled through this bridge so that during one-half cycle of the local oscillator signal, the signal frequency is in one phase and during the other half cycle of the local oscillator signal, the signal frequency is phase reversed; this is commonly referred to as a biphase signal. In operation, the diode bridge acts as a double-pole, double-throw (reversing) switch between the input signal and intermediate frequency ports, the switch being driven at the rate of the local oscillator signal.

While this type of mixer has been commercially used, the mixer has certain limitations which limit its more widespread use. One problem is that the two branches of the diode bridge that are non-conducting, while the other two branches are conducting, are only held in a non-conductive state by a voltage equal to the forward bias voltage of the conducting diodes. This voltage is insufficient for large signal handling capability or for adequate prevention of intermodulation generation produced by the non-linear part of the diode characteristic.

SUMMARY OF THE INVENTION

It is an object of the invention to provide an improved circuit for driving diodes used as switches.

It is an additional object of the invention to provide an improved doubly balanced mixer which incorporates the abovementioned circuit for driving diodes and a method of mixing which overcomes the problems previously mentioned.

It is another object of the invention to provide a mixer with optimum dynamic range based on a given characteristic of a control device, such as a diode.

According to one aspect of the present invention, there is provided a circuit for mixing first and second rf signals to produce an output signal containing a beat frequency. The circuit includes a pair of switches, each having a balun for balancing and removing common mode signals from the first rf signal, a diode bridge receiving the balanced first rf signal at a control port for controlling the conductive state of the diodes to provide alternating high and low impedance levels at a switch port. The switch port of the bridges provides opposite impedance levels during each half cycle of the first rf signal. According to the invention, the first rf signal is terminated in a matched impedance level irrespective of the conductive state of the diodes of the switch. A hybrid receiving the second rf signal at an input port has summing and difference ports coupled to the switch port of the switches to produce the beat frequency at an output port. The hybrid has a balun for balancing and removing common mode signals from the output signal.

According to other aspects of the invention, there is provided an improved circuit for driving diodes used as switches, such as in a frequency doubler circuit, a sample and hold circuit and the like.

DESCRIPTION OF PREFERRED EMBODIMENT

Figure 1:
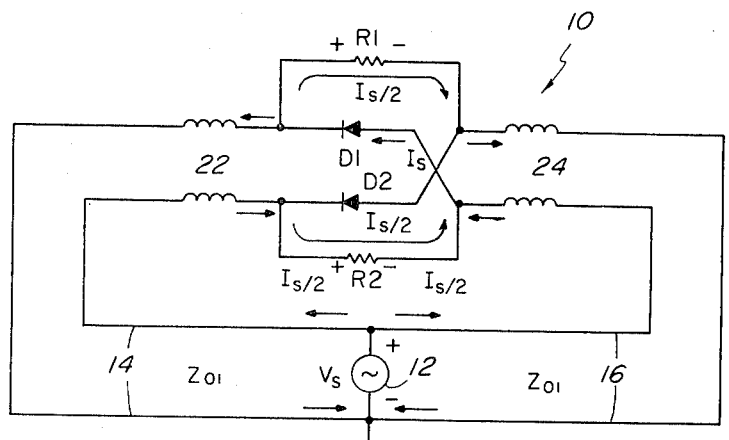
FIG. 1 is a schematic diagram of a drive circuit for an arrangement of diodes used as a switch according to the invention.

In an exemplary embodiment of the present invention, as illustrated in FIG. 1, there is shown a drive circuit 10 for an arrangement of diodes used in a switching mode. The drive circuit 10 includes a source of a radio frequency (rf) signal 12 providing a voltage designated $V_s$. Transmission lines 14 and 16 having a characteristic impedance equal to $Z_{01}$ divide the rf signal into a pair of equal current components illustrated by the reference arrows identified as $I_s/2$ for the illustrated instantaneous polarity of voltage $V_s$ from the source 12. Transmission lines 14 and 16 are coupled to baluns 22 and 24, respectively, which balance and remove common mode signals from the current components from the source 12. A pair of diodes D1 and D2 are coupled between the baluns 22 and 24 such that when one diode is conductive, the other diode is non-conductive. Load resistors R1 and R2 also coupled between baluns 22 and 24 provide a matched termination for the current components $I_s/2$. During the half cycle of the rf signal from source 12 in which $V_s$ is of the polarity shown, the diode D1 is conductive forming a path for both current components $I_s$, diode D2 is non-conductive, and each of the resistors R1 and R2 forms a termination for one current component $I_s/2$. During the other half cycle of the source in which $V_s$ is of a polarity which is opposite to that shown, the directions of the current components $I_s/2$ in the transmission lines 14 and 16 are opposite to that shown in FIG. 1. Accordingly, diode D1 is nonconductive, diode D2 is conductive forming a path for both current components $I_s$, and each of resistors R1 and R2 forms a conductive path for one current component $I_s/2$. Each of resistors R1 and R2 has a value of resistance equal to the characteristic impedance $Z_{01}$ of the transmission lines 14 and 16. The reverse bias voltage $V_r$ is equal to $2(I_s/2)(Z_{01})$.

One aspect of the invention is realized in that the resistors R1 and R2 provide matched termination for the driving transmission lines during both half cycles of the rf signal so that the $V_s$ port appears "matched."

Another aspect of the invention is realized in that the circuit 10 in FIG. 1 may be used as a broad band frequency doubler circuit by observing that the waveform of voltage across and the current through either of the resistors R1 and R2 is the full-wave rectified driving signal $V_s$ containing a second harmonic component and that the full-wave rectification is frequency independent and that separation of the fundamental and second harmonic signals takes place by symmetry so that narrow band tuning is not required.

Figure 2:
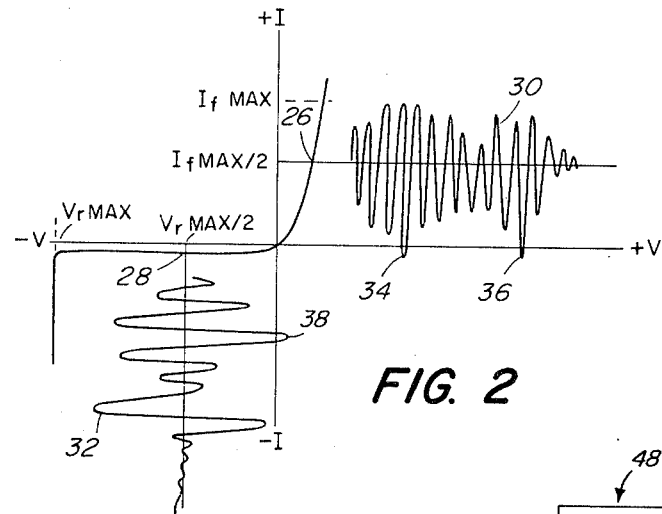
FIG. 2 is a graph illustrating how proper selection of termination for the diode drive signal optimizes the dynamic range of the diodes in FIG. 1.

In certain applications for the drive circuit 10, such as when the circuit is used in a mixer as will be hereinafter described, it is advantageous to establish the characteristic impedance $Z_{01}$ and R1 and R2 as a function of the characteristic of the diodes D1 and D2. When the drive circuit 10 is used in a mixer each of the diodes is replaced by a four-diode bridge and two signals are coupled across opposing terminals of the bridge. Accordingly, the conductive diodes carry both the current $I_s$, and the current from the second signal source, and the non-conductive diodes are biased by the sum of voltages from the source 12 and from the second signal source across the non-conductive diode. FIG. 2 illustrates the typical characteristic of a diode in which the horizontal and vertical axes represent voltage and current, respectively. In the first quadrant, the diode is forward biased, and there is defined a maximum forward bias current $I_f(max)$ which the diode can carry. In the third quadrant, the diode is reverse biased, and there is defined a maximum reverse bias voltage $V_r(max)$ at which the diode breaks down. Numeral 26 is the operating point due to source 12 on the characteristic curve when the diode is conductive and 28 is the operating point when the diode is non-conductive. Waveform 30 is of the current of the signal to be mixed when the diode is forward biased, and waveform 32 is of the voltage of the signal to be mixed when the diode is non-conductive. At locations 34 and 36 of waveform 30, the current of the second signal momentarily reverse biases the diode, and at locations 38 on waveform 32, the second signal momentarily forward biases the diode. At these locations, the dynamic range of the mixer is exceeded. However, it has been found that to maximize the dynamic range, the drive circuit of the mixer should be designed such that the operating point on the forward bias portion of the diode characteristics curve is at half the maximum forward bias current $I_f(max/2)$ and the operating point on the reverse bias portion of the diode characteristic is at half the maximum reverse bias voltage $V_r(max/2)$ as shown. According to the invention, these two conditions are satisfied simultaneously if the characteristic impedance of the rf signal source 12 and the resistance of R1 and R2 are equal to $V_r(max)/I_f(max)$.

Figure 3:
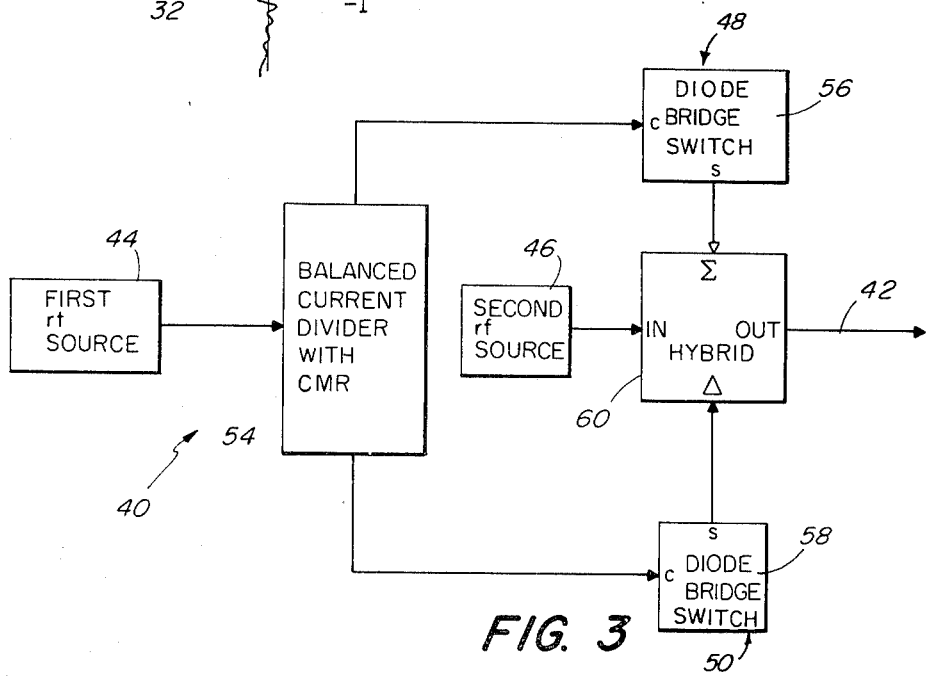
FIG. 3 is a block diagram of a mixer according to the present invention.

Referring now to FIG. 3, there is illustrated a block diagram of a circuit 40 for mixing first and second rf signals to produce an output signal at 42 containing a beat frequency. The mixer 40 includes a source 44 of a first rf signal and a source 46 of a second rf signal. A pair of switches 48 and 50 are controlled by the first rf signal which is coupled to a balanced current divider 54 with common mode current rejection characteristics (CMR). The switch 48 includes a diode bridge 56 receiving a balanced first rf signal from the divider 54 at a control port (c) for controlling the conductive state of the diodes to provide alternating high and low impedance levels at a switch port (s). Likewise, the switch 50 includes a diode bridge 58 receiving a balanced first rf signal from the divider 54 at a control port (c) for controlling the conductive state of the diodes to provide alternating high and low impedance levels at a switch port (s). The switch port (s) of each of the bridges 56 and 58 provides opposite impedance levels during each half cycle of the first rf signal. Each diode bridge 56 and 58 includes a load means for providing matched termination of the first rf signal irrespective of the conductive state of the diodes of the switch. Thus, the switches 56 and 58 together comprise the embodiment of FIG. 1, except that the diode bridges replace the diodes D1 and D2 of FIG. 1.

Figure 4:
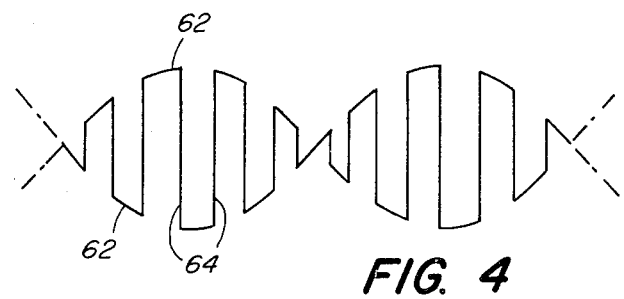
FIG. 4 is a waveform of the output of the mixer shown in FIG. 3.

A hybrid 60 receives the second rf signal from the source 46 at an input port (in). A summing port ($\Sigma$) is coupled to the switch port (s) of the diode bridge 56 and a difference port ($\Delta$) is coupled to the switch port (s) of the diode bridge 58. Accordingly, an output port (out) produces the beat frequency. The hybrid 60 has a balun (not shown) for balancing and removing common mode signals from the second rf signal from the source 34 and a balun (not shown) for removing common mode signals from the signal at the output port (out). FIG. 4 illustrates the waveform of the signal at the output port of the hybrid 50. The envelope 62 of the second rf signal is chopped and phase reversed at the frequency 64 of the first rf signal.

Figure 5:
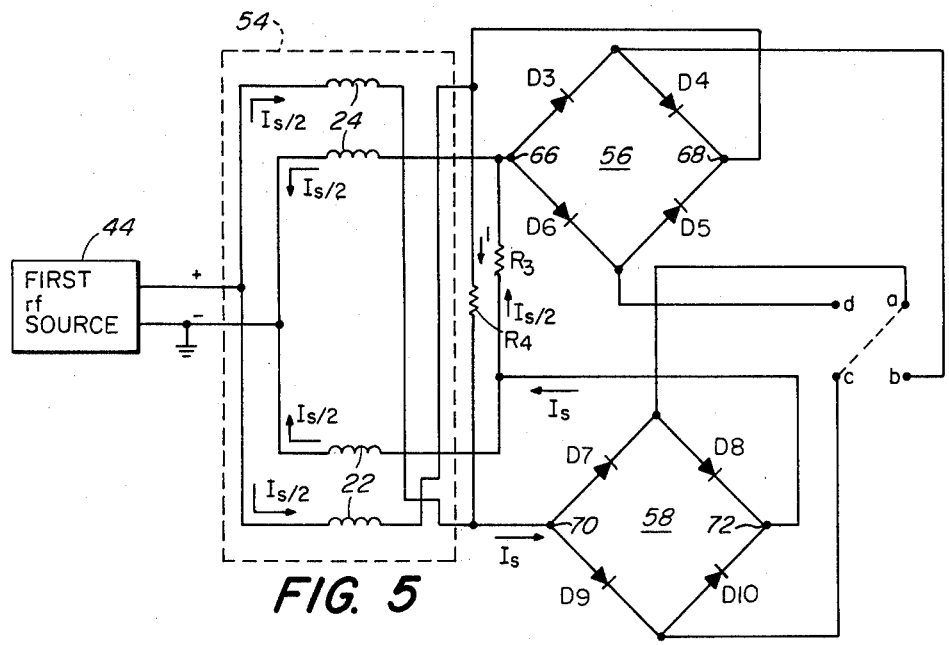
FIG. 5 is a schematic diagram of the switch drive circuit of the diagram of FIG. 3.
Figure 6:
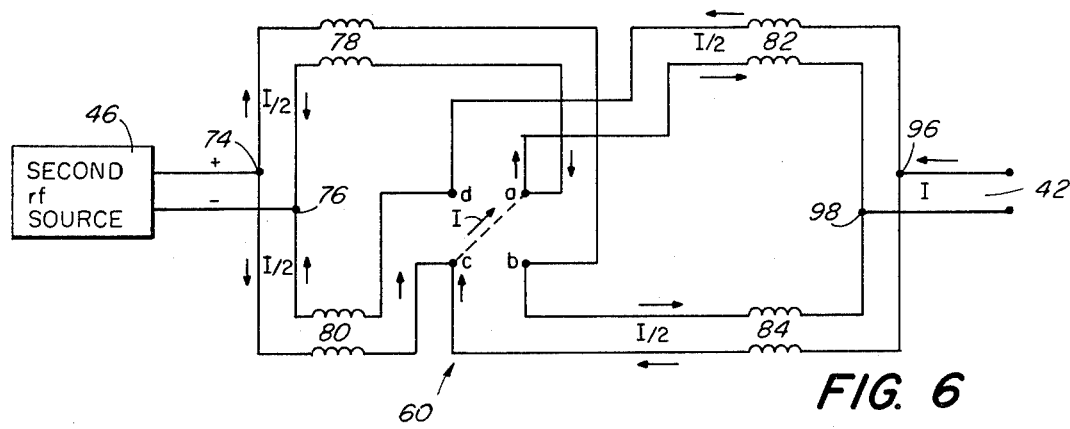
FIG. 6 is a schematic diagram of the hybrid shown in block diagram form in FIG. 3.

FIGS. 5 and 6 illustrate in more detail the block diagram of the mixer 40 of FIG. 3, FIG. 5 illustrating the drive circuitry for the switches and FIG. 6 illustrating the hybrid 60. In FIG. 5, the divider 54 includes the baluns 22 and 24, each of which comprises a pair of coils which are bifilar wound on a ferrite core. Each of the diode bridges 56 and 58 comprises four interconnected branches each having a diode. The diodes of bridge 56 are designated D3, D4, D5 and D6 and the diodes of the bridge 58 are designated D7, D8, D9 and D10. In diode bridge 56, opposed junctions 66 and 68 of the branches define the control port (c), and in diode bridge 58, opposed junctions 70 and 72 define the control port (c). All diodes in each bridge are coupled in the same conduction sense with respect to the control port. The connection of the respective control port to the divider 54 is such that the bridges 56 and 58 have opposite conductive states during each half cycle of the first rf signal. In bridge 56, junctions b and d define the switch port (s), and in bridge 58, junctions a and c define the control port (c). A resistor R3 is coupled between control port junction 66 of the bridge 56 and control port junction 72 of the bridge 58. Resistor R4 is coupled between control port junction 68 of the bridge 56 and control port junction 70 of the bridge 58. The interconnection of diode bridges 56 and 58 and resistors R3 and R4 results in a single bridge in which each of one pair of opposed branches contains one of the diode bridges and in which each of the other pair of opposed branches contains one of the resistors. The resistors R3 and R4 are each equal to the characteristic impedance of the transmission line extending from the first rf source 44 and preferably, the resistors and the line are chosen to provide maximum dynamic range, as previously discussed.

In operation, assume that the polarity of voltage from the first rf source 44 is as shown. This voltage produces a balanced current components $I_S/2$ in each of the baluns 22 and 24 and causes diode bridge 58 to be conductive and diode bridge 56 to be non-conductive. A current of $I_S$ flows through the bridge 58 and resistors R3 and R4 form a termination for each of the two components $I_S/2$ forming the total current $I_S$. Accordingly, the impedance across terminals a and c of the bridge 58 is ideally zero, and the impedance across terminals b and d of bridge 56 is ideally infinite. During the opposite half cycle of the first rf signal source, the direction of the current components reverse, and diode bridge 56 becomes conductive and diode bridge 58 becomes non-conductive.

FIG. 6 illustrates the details of the hybrid 60 shown in block diagram form in FIG. 3. The second rf signal from the source 46 is coupled to the input port (in) which comprises terminals 74 and 76. This signal is coupled to baluns 78 and 80. These baluns, each of which comprises a pair of coils bifilar wound on a ferrite core, divide the second rf signal into a pair of balanced current components and reject common mode signals on the second rf signal. The balun 78 is coupled to terminals a and b, and the balun 80 is coupled to the terminals c and d. Terminals a and c comprise the sum ($\Sigma$) port, and terminals b and d comprise the difference port ($\Delta$) of the hybrid 60. The output signal at 42 containing the beat frequency is developed by combining the signals across terminals a and d and terminals c and b. Baluns 82 and 84 combine the divided current components to an unbalanced condition and rejection common mode signals. Terminals 96 and 98 define the output port (out) of the balun 60.

To assist in understanding the overall operation of the mixer 44, assume that the polarity of the first rf signal is such as to produce a short circuit across the terminals a and c and an open circuit across terminals b and d of hybrid 60 and that the second rf signal is such as to produce a polarity of voltage across terminals 74 and 76 as shown in FIG. 6. Current I from source 44 is divided by baluns 22 and 24 into components I/2. These components combine to form current I from terminal c to a of summing port ($\Sigma$) of hybrid 60. After dividing again, the current components I/2 combine to form current I at the output port of the hybrid but with a phase reversal with respect to the input port. When terminals b and d form the short circuit and a and c form an open circuit, the current from source 46 is not phase reversed in passing through the hybrid 60.

Figure 7:
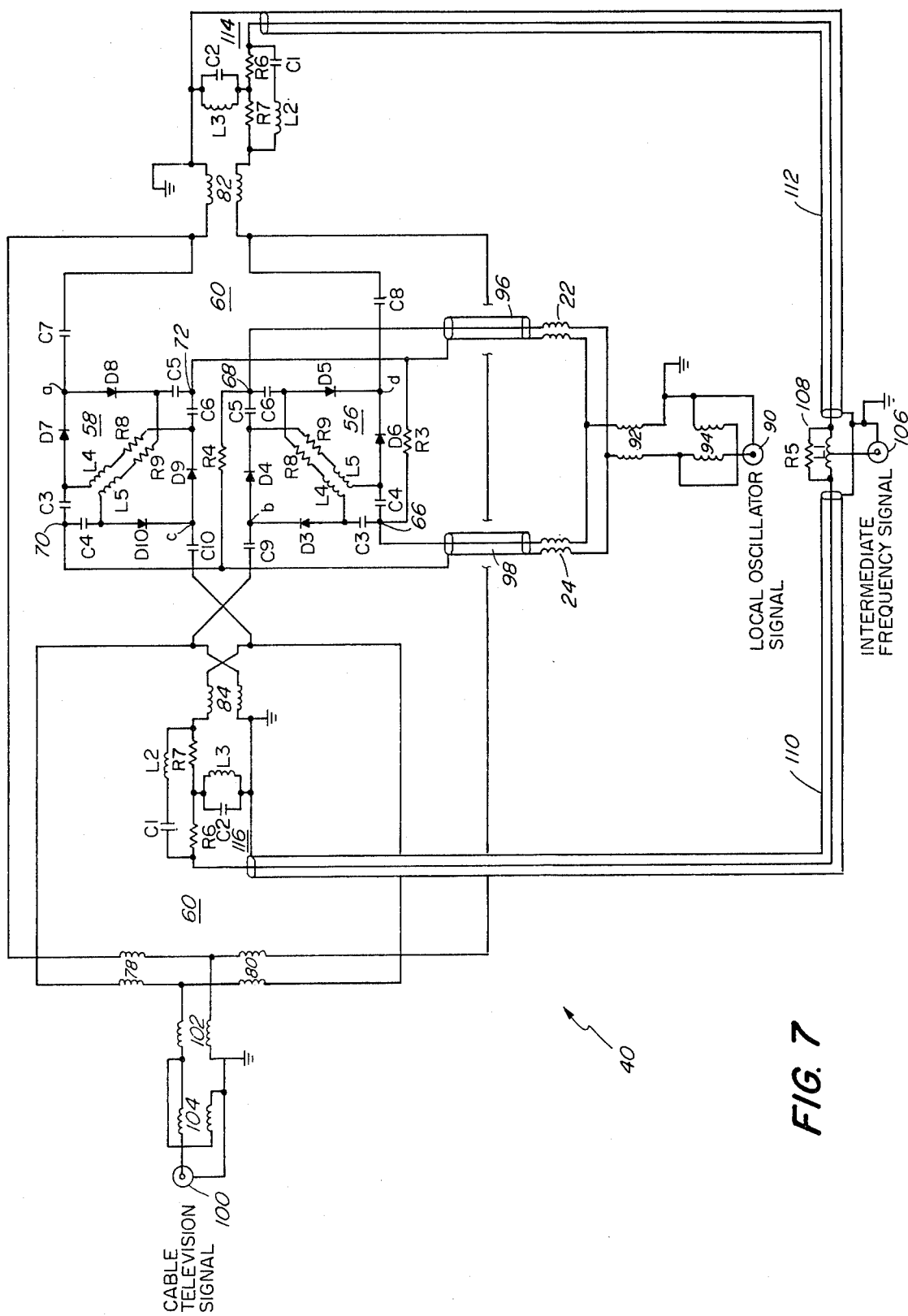
FIG. 7 is a detailed schematic diagram of a mixer according to the invention.

FIG. 7 is a schematic diagram of a mixer showing additionally preferred features and being used in a cable television CATV system. It should be understood, however, that the mixer of the present invention could be used for any application wherein it is desired to mix frequencies of a pair of signals. With the advent of CATV systems with more than 12 channels, a mixer is necessary for converting program material from a form in which it is transmitted over a transmission line, into a form in which it can be readily used by a conventional television receiver. The mixer is coupled between the transmission line and the input of the television receiver. The mixer should be capable of handling up to thirty-six or more CATV channels, which comprise the second rf signal source; these channels cover a range of frequencies from 54 MHz to 300 MHz. The signals of the input channels are raised or converted by a local oscillator, which is the first rf signal source, to a high intermediate frequency, such as 375 MHz. Then, the selected channel is lowered in frequency or converted from the high intermediate frequency channel by another mixer to a frequency band coexistent with a predetermined VHF television channel. Such a mixer generates a beat frequency which may, for example, be the difference frequency. The local oscillator provides a frequency controllable output signal ranging in frequencies typically from 430 MHz to 675 MHz.

Components in FIG. 7 which have previously been described will be given the same reference numerals or designations as in FIGS. 5 and 6. The local oscillator signal at transmission line 90 comprises the first rf signal and is coupled to the baluns 22 and 24. If desired, a separate balun 92, which is a pair of coils bifilar wound on a ferrite core, may be provided for converting the unbalanced local oscillator signal into a balanced condition. Also, an impedance transformer 94 may be used to make the impedance of the local oscillator (not shown) compatible with the termination of the local oscillator signal within the mixer. The output of baluns 22 and 24 are coupled via transmission lines 96 and 98, respectively, to the control ports of the diode bridges 56 and 58. The cable television signal at transmission line 100 comprises the second rf signal and is coupled to the baluns 78 and 80. If desired, a separate balun 102, which is a pair of coils bifilar wound on a ferrite core, may be provided for converting the unbalanced cable television signal into a balanced condition. Also, an impedance transformer 104 may be used to make the impedance of the cable television transmission line 100 compatible with the termination of the CATV signal within the mixer. The intermediate frequency signal is provided at a transmission line 106 which is coupled to a current combiner 108 comprising a coil L1 and a resistor R5. Combiner 108 combines signals from transmission lines 110 and 112.

In one additional feature of the embodiment in FIG. 7, the mixer 40 includes the capability of separating the desired intermediate frequency from the other frequency components which are included in the output signal. In the preferred embodiment, the intermediate frequency is the difference in frequencies between the frequency of the cable television signal and the frequency of the local oscillator signal. Accordingly, baluns 82 and 84 are coupled to filters 114 and 116, respectively. The filters 114 and 116 are known in the art as constant resistance bridged-T filters or bridged-T equivalent of constant resistance lattice filters. These filters provide a termination for all frequencies, except for the intermediate frequency, generated by the biphase modulation. On the other hand, they pass frequencies close to the selected intermediate frequency which is 375 MHz in this embodiment. This type of filter does not provide a good band-pass characteristic but its special property of providing termination for all filtered frequencies is found to be desirable for optimum mixer performance.

The filters 114 and 116 are identical and, for this reason, identical components in each filter shall be given the same identification for simplicity. For each filter, one branch of the filter includes the parallel combination of resistors R6 and R7 in series and of capacitor C1 and inductor L2 in series. A parallel combination of a capacitor C2 and an inductor L3 is coupled between the other branch of the filter and the junction of the resistors R6 and R7. In operation, at the desired intermediate frequency, the combination of C1 and L2 forms a series resonant circuit and the combination of C2 and L3 forms a parallel resonant circuit. Therefore, the two branches of the filter are isolated at this frequency and thus, the intermediate frequency passes through the filter in a substantially loss-less manner. At other frequencies, however, the filter acts as a matched termination load.

In another feature, each of the diode bridges 56 and 58 has the capability of coupling all of the diodes of the bridge in series with respect to an average dc component of the respective local oscillator signal component. Thus, all of the diodes conduct at the same current level, thereby insuring that the voltage across the switching junctions a, c and b, d, due to the local oscillator signal, is substantially zero volts. This feature is accomplished in the following manner. A capacitor is coupled in each branch of the bridge such that each capacitor is coupled between the diode in the branch and one of the control junctions. These capacitors in each bridge are identified by the designations C3, C4, C5 and C6. These capacitors form a low impedance path for the harmonic components of the local oscillator signal but form a high impedance path for the dc component of the local oscillator signal. Further, first and second dc shunt paths are coupled between the junction of the capacitor and diode of one branch to the junction of the capacitor and the diode of an oppositely located branch. The first shunt path includes the series connection of an inductor L4 and a resistor R8. The second shut path includes the series connection of an inductor L5 and resistor R9. The inductors L4 and L5 comprise a high impedance to harmonic components of the local oscillator signal, and the resistors R8 and R9 form a termination for the dc component of the local oscillator signal. This dc component results from the average value of the full-wave rectified local oscillator signal appearing across R3 and R4. Therefore, the ohmic value of R8, and R9 should be one-half of ohmic value of R3 and R4 in order to keep the drive circuit "matched."

The mixer 40 also includes a capacitor coupled to each of the switching junctions of each bridge to prohibit the output signals from including the dc component derived from the full-wave rectification of the local oscillator signal. These capacitors are identified by the reference designations C7, C8, C9, and C10.

In another aspect of the invention relating to an improved control circuit for a diode switch, the circuit may be used as part of a sample and hold (S/H) circuit. The S/H circuit is typically used in the conversion of an analog signal into a digital signal. The analog signal is sampled at a rate established by the frequency of a sampling signal and the amplitude of the analog signal is held for a time interval adequate to permit the amplitude to be converted into a suitable digital signal. It is important in a S/H circuit to have high isolation between the analog signal source and the holding element, usually a capacitor, during the hold period; if appreciable voltage feedthrough is present due to poor isolation, then the accuracy of the A/D conversion process is impaired. It is also important, especially where the analog and sampling signals are in the rf portion of the electromagnetic spectrum, that the S/H circuit operate at high speeds.

In a typically known S/H circuit, a single diode bridge is used wherein the sampling signal controls the conductive state of the diode of the bridge. The analog signal is coupled through the bridge to charge a holding capacitor ($C_h$) during the sample interval, and during the hold interval, the diodes of the bridge are non-conductive. However, during the hold interval, the analog signal is coupled to the hold capacitor via the capacitance ($C_o$) of a diode in the reverse bias condition. To reduce coupling, the hold capacitor must be made large compared to $C_o$ as shown by the following equation:

$V_{ft} = C_o/(C_h + C_o) \, V \text{ sig.}$

However, this reduces the speed of charging the hold capacitor $C_h$ and thus slows down the operation of the S/H circuit. Another way of reducing feedthrough is to neutralize the feedthrough voltage at the holding capacitor during the hold period. This can be done by coupling the phase inverted analog signal to the hold capacitor via an adjustable capacitor which cancels the capacitive effect of the reverse biased diodes. However, this requires broadband symmetry for cancellation which is difficult to realize in practice.

Figure 8:
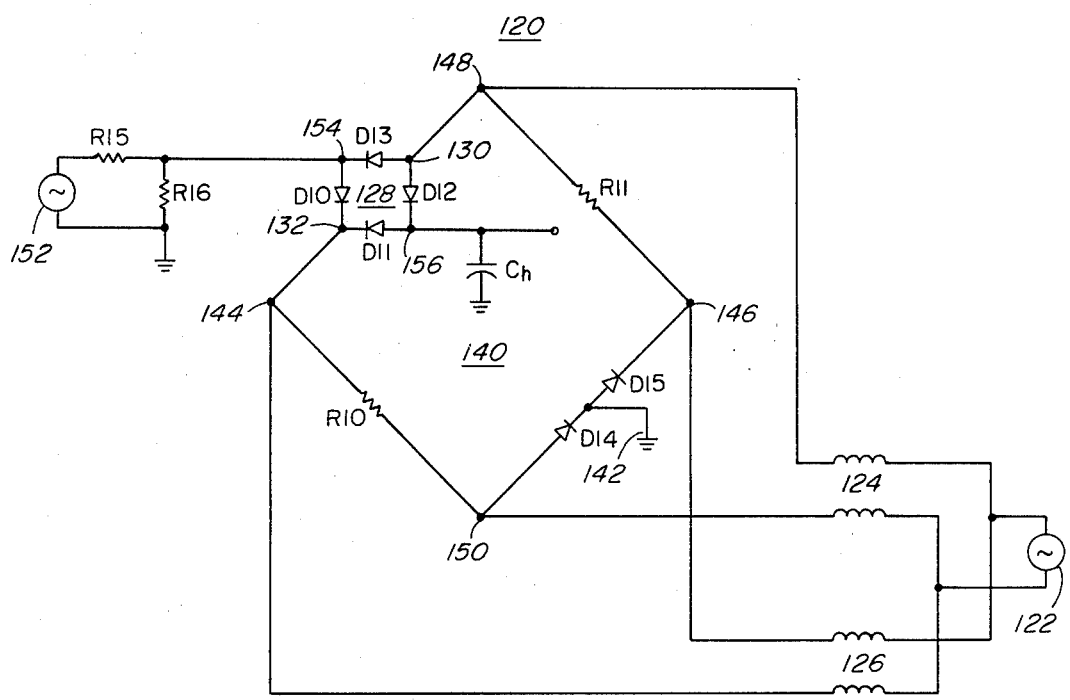
FIG. 8 is a schematic diagram of a sample and hold circuit according to the invention.

FIG. 8 illustrates an improved sample and hold circuit 120 according to the invention. The sample command signal from signal source 122 is divided into a pair of balanced current components by baluns 124 and 126. The baluns remove common mode signals from the divided current components of the signal from source 122. A diode bridge 128 includes four interconnected branches each having a diode represented collectively as D10, D11, D12 and D13. The diodes of the bridge 128 are coupled in the same conduction sense with respect to one pair of opposed junctions of the diode bridge, these junctions being identified as 130 and 132. The diode bridge 128 forms one branch of a larger resulting bridge, represented generally by the reference numeral 140. The branch of the bridge 140 opposite to that containing the diode bridge 128 includes a pair of diodes D14 and D15 which are coupled together in the same conduction sense, the junction between the diodes being grounded at 142. Resistors R10 and R11 are disposed in the opposite pair of branches of the bridge 140. The values of these resistors are selected to achieve optimum dynamic range as previously discussed. One balanced component of the signal from the source 122 is coupled to the bridge 140 at junctions 144 and 146. Similarly, the other balanced component from the source 122 is coupled to opposed junctions 148 and 150 of the bridge 140. To understand the operation of the sample and hold circuit 120 as thus far described, assume that the polarity of the sample command from the source 122 is such that the upper output terminal from source 122 is positive with respect to the lower output terminal. This causes the diode bridge 128 to be conductive and the pair of diodes in the opposite branch of the bridge to be non-conductive. Current flow of one component is through the balun 124, bridge 128, resistor R10 and balun 124. Current flow of the other component is through balun 126, resistor R11, diode bridge 128 and balun 126. This polarity from the source 122 represents the sample period of the sample and hold circuit 120. During the period of opposite polarity of the signal from the source 122, the lower output terminal from the source 122 is positive with respect to the upper terminal. Accordingly, the diode bridge 128 becomes non-conductive and the pair of diodes in the opposite branch becomes conductive. Current flow of one component is through balun 124, diodes D14 and D15, resistor R11, and balun 124. Current flow of the other component is through balun 126, resistor R10, diodes D14 and D15, and balun 126. This polarity from the source 122 represents the hold period of the sample and hold circuit 120.

A source 152 of an rf signal is coupled to a junction 154 of the diode bridge 128, the signal being taken from the junction of resistors R15 and R16. A holding capacitor $C_h$ is coupled to the junction 156 of the bridge 128. When bridge 128 is conductive, the signal from source 152 charges capacitor $C_h$. When bridge 128 is non-conductive, the source 152 is isolated from capacitor $C_h$.

Figure 9:
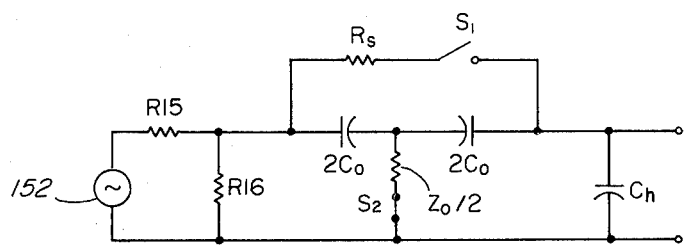
FIG. 9 is an equivalent circuit of the circuit of FIG. 8 during the hold condition.

This feature is shown more clearly in FIG. 9 which is an equivalent circuit of the sample and hold circuit shown in FIG. 8 during the hold interval. The diode bridge 128 is represented as the branch including resistor $R_s$ and the open switch $S_1$ in parallel with the series combination of a pair of capacitors $2C_o$. The branch of the bridge 140 containing the diodes D14 and D15 is represented as closed switch $S_2$ and $Z_o/2$ represents resistors R10 and R11 in parallel. The junction capacitance at the reverse bias operating point is smaller than the known S/H circuits since the reverse bias is larger due to the dual diode bridge arrangement. For the frequency range (rf) where the following is true:

$Z_o << (1/\omega C_o)$ $Z_o << (1/\omega C_h)$ $C_o << C_h$

The equation for defining $V_{fl}$ is as follows
$V_{fl} \cong 2C_o/(C_h+2C_o)Z_o\omega C_o(V\text{ sig.})$ For typical circuit parameters, such as $C_o = 1 \times e^{-12} f$, $\omega = 1 \times e^8$ and $Z_o = 50$ ohms, $V_{fl}$ is reduced by a factor of 100 over that of the previously mentioned known S/H circuit.

The embodiments of the present invention are intended to be merely exemplary and those skilled in the art shall be able to make numerous variations and modifications of them without departing from the spirit and scope of the present invention. All such variations and modifications are intended to be within the scope of the present invention as defined by the appended claims.

I claim:

1. A circuit comprising:
   (a) a source of an RF signal,
   (b) means for dividing the rf signal into a pair of balanced equal current components,
   (c) first and second diode bridge means coupled to the dividing means such that during one polarity of the rf signal the first diode bridge means is forward biased and forms a conductive path, for both current components and the second diode bridge means is reverse biased and such that during the other polarity of the rf signal the second diode bridge means is forward biased and forms a conductive path for the current components and the first diode bridge means is reverse biased, and
   (d) means for providing matched termination for each of the current components of the rf signal during each polarity of the rf signal, and
   (e) means for coupling all diodes of each bridge in series with respect to each other with respect to the average dc current component of the rf signal to enhance the matched operation of the diodes.

2. The circuit according to claim 1 wherein the means providing matched termination includes first and second resistors coupled to the first and second diode means and the characteristic impedance of the transmission line carrying the balanced current components being equal to the peak reverse bias voltage of the diode means divided by the peak forward bias current of the diode means.

3. The circuit according to claim 2 wherein the circuit is a frequency-doubler circuit providing a full-wave rectified signal at either of the first and second resistors.

4. The circuit according to claim 1 wherein the circuit is a control circuit for a diode switch, the dividing means having a pair of baluns for balancing and removing common mode signals from the first and second current components of the rf signal, the first and second diode means each having four interconnected branches each having at least one diode, one pair of opposed junctions of the branches being coupled across the baluns, the diodes of each bridge being coupled in the same conduction sense with respect to the opposed junctions.

5. The circuit according to claim 2 wherein the circuit is a sample and hold circuit, the dividing means having a pair of baluns for balancing and removing common mode signals from the first and second current components of the rf signal, the first diode means comprising a bridge having four interconnected branches each having at least one diode, the diodes of the bridge being coupled in the same conduction sense with respect to one pair of opposed junctions of the diode bridge, the second diode means comprising at least a pair of diodes coupled together in the same conduction sense, the first and second resistors being coupled to the diode bridge and the pair of diodes to result in a bridge in which each of one pair of opposed branches of the resulting bridge contains one of the diode bridges and the pair of diodes, and in which each of the other pair of opposed branches of the resulting bridge contains one of the first and second resistors, the balanced components from the dividing means of the rf signal being coupled across opposed junctions of the branches of a resulting bridge and further including:
   (a) a source of a second rf signal coupled to a junction of the diode bridge exclusive of junctions coupled to the resulting bridge,
   (b) a holding capacitor coupled to the other junction of the diode bridge exclusive of those junctions coupled to the resulting bridge, and
   (c) the sample and hold circuit being effective upon the rf signal being of a polarity to cause the diode bridge to conduct and the pair of diodes to be non-conductive to charge the holding capacitor to a level representative of the level at that time of the second rf signal and upon the rf signal being of a second polarity to cause the diode bridge to be non-conductive and the pair of diodes to be conductive, the impedance of the capacitance of the non-conductive diodes of the diode bridge and the first and second resistors being effective to provide high isolation between the holding capacitor and the second rf source during the hold period of the sample and hold circuit.

* * * * *